US006255823B1

(12) United States Patent
Carrozzi et al.

(10) Patent No.: US 6,255,823 B1
(45) Date of Patent: Jul. 3, 2001

(54) FARADAY CAGE, PARTICULARLY FOR NUCLEAR MAGNETIC RESONANCE APPLICATIONS

(75) Inventors: Alessandro Carrozzi, La Spezia; Leonardo Diaferia, Ruvo di Puglia, both of (IT)

(73) Assignees: Esaote SpA; ITEL Telecommunicazioni SrL, both of (IT)

( * ) Notice: Subject to any disclaimer, the term of this patent is extended or adjusted under 35 U.S.C. 154(b) by 0 days.

(21) Appl. No.: 09/427,759

(22) Filed: Oct. 27, 1999

(30) Foreign Application Priority Data

Nov. 26, 1998 (IT) .............................. SV98A0069

(51) Int. Cl.[7] ...................................... G01V 3/00
(52) U.S. Cl. ......................... 324/318; 324/322; 324/309
(58) Field of Search ................... 324/318, 300, 324/320, 322, 309

(56) References Cited

U.S. PATENT DOCUMENTS

| 3,557,777 | * | 1/1971 | Cohen | 128/2 |
| 4,564,812 | | 1/1986 | Van Dijk | 324/309 |
| 4,613,820 | | 9/1986 | Edelstein et al. | 324/318 |
| 4,753,038 | | 6/1988 | Sohlström | 49/212 |
| 5,043,529 | | 8/1991 | Vanesky et al. | 174/35 |
| 5,394,873 | * | 3/1995 | Kraemer et al. | 128/653.2 |

FOREIGN PATENT DOCUMENTS

| 666 076 | 6/1988 | (CH) . |
| 3519365 A1 | 4/1986 | (DE) . |
| 40 11 660 | 10/1991 | (DE) . |
| 0 503 106 A1 | 8/1991 | (EP) . |
| 2 234 636 | 2/1991 | (GB) . |
| 4-059349 | 2/1992 | (JP) . |

* cited by examiner

Primary Examiner—Jay Patidar
Assistant Examiner—Brij B. Shrivastav
(74) Attorney, Agent, or Firm—Burns, Doane, Swecker & Mathis, L.L.P.

(57) ABSTRACT

The invention relates to a Faraday cage, particularly for Nuclear Magnetic Resonance applications, comprising grounding means. According to the invention, the cage has the form of a prefabricated room or closet, which can be installed inside existing premises, without requiring building works, and includes preferably modular prefabricated parts (101, 201, 601, 701, 901, 2, 7, 16, 17), made of an electrically conductive material, which can be assembled together by mechanical and electric connection means (301, 501, 14, 15). According to an important characteristic, the surfaces of the cage walls have a plurality of apertures, particularly holes (302), having such characteristics as to allow effective communication with the outside environment, both in terms of lighting and venting, in combination with a predetermined level of electromagnetic noise suppression.

50 Claims, 15 Drawing Sheets

FARADAY CAGE, PARTICULARLY FOR NUCLEAR MAGNETIC RESONANCE APPLICATIONS

BACKGROUND OF THE INVENTION

1. Field of the Invention

The invention relates to a Faraday cage, particularly for Nuclear Magnetic Resonance applications, comprising grounding means or means having a predetermined potential.

2. Description of Related Art

The importance of suppressing electromagnetic noise from the environment is well-known in the field of imaging by Nuclear Magnetic Resonance machines, hereafter indicated as MRI.

This noise, when it is not properly suppressed, can generate artifacts or parasitic images which deteriorate the quality of the acquired image.

Such suppression, always indispensable in MRI diagnostics, is particularly critical when using MRI equipment of the so-called dedicated type, i.e. designed to imaging of limited parts of the body or anatomic districts thereof, because, in order to improve installation simplicity and cost reduction, alternatives to costly and complex traditional solutions are needed.

Also, in dedicated machines, the patient body may act someway as an antenna, because it is almost entirely outside the imaging cavity, and so it captures electromagnetic noise and transmits it inside.

While prior art systems have costs which justify the use thereof in high and medium cost machines, in low and medium cost arrangements partial solutions are used, which avoid Faraday cages, because of the cost influence of these cages on the overall cost of the machine.

Although various solutions have been proposed for suppressing such noise, such as grounding the patient body and/or the medical staff by appropriate arrangements, or using self-shielding equipment, the best solution always consists in a Faraday cage electromagnetic shield enclosing the equipment, the patient and possibly the medical staff. Hence, the need arises to provide more attractive Faraday cages even for machines of a lower cost range.

OBJECTS AND SUMMARY

The invention has the object to provide, by using simple and comparatively inexpensive arrangements, a Faraday cage: which provides an effective electromagnetic shield to ensure suppression of noise signals interfering with MRI; which can be assembled and installed inside existing premises, without requiring building works, and ensuring a highly versatile installation, with the additional advantage that bureaucracy for building works is simplified or avoided; which has such a size as to delimit a sufficient volume to perform imaging operations, and at the same time such as to allow integration in relatively limited spaces; which provides a shielded area of limited dimensions in rooms possibly having a greater extension than the cage, and so usable for simultaneous diagnostic and/or therapeutic activities; which has such functional and dimensional characteristics as to allow a considerable adaptability to different environmental conditions; which can be easily carried and assembled and, when needed, dismantled and transferred from a room to another; which has a wide opening for carrying in/out the equipment and the patient, even on a stretcher; which is provided with opening means that can be opened/closed without increasing the dimensions of the cage and disposed so that they can be located at the entrance of the room housing the cage; said opening/closing means having such characteristics as to attenuate the noise suppression level, when in the closed condition; which has a light weight; which allows a good communication with the outside environment with reference to the elimination of equipment heat, to moisture, lighting, venting conditions, and to the possibility of direct verbal communication, and such as to avoid the need to provide the cage with its own lighting and air-conditioning means, potential sources of additional noise and causes of cost increase; which has a safe use.

The invention achieves the above objects by providing a Faraday cage as described hereinbefore, having the form of a prefabricated room or cabinet, which can be easily assembled inside existing premises, and when needed, as easily dismantled.

The cage may be composed of prefabricated members which may be assembled together without requiring building works and can be installed/dismantled with no masonry works.

The prefabricated members may be made of an electrically conductive material, preferably metal, and be connected to each other by electrically conductive connection means, also preferably made of metal. Advantageously, these means may generate electric contact between the construction parts, upon mechanical connection.

The cage and/or the prefabricated parts may have a modular construction. Particularly, a limited number of different types of substantially identical construction parts, within the same type range may be provided. For instance, the walls may all be made by assembling parts of the same type, and the same may be provided, for instance, for opening/closing means.

Thanks to the above arrangements, a Faraday cage may be provided, particularly for MRI applications which, besides providing an effective electromagnetic shield against all noise interfering with imaging operations, can be assembled and dismantled inside its designated room without requiring building works and by non qualified personnel. This provides a particularly versatile and economical installation of the cage, and allows to simplify or even avoid bureaucracy for building works, e.g. when it is located in buildings of historical and/or artistic interest.

A further advantage consists in that the cage can be installed in very large rooms, allowing the creation of a shielding zone of a limited size, and leaving the largest part of the room free for simultaneously performing other diagnostic and/or therapeutic activities. Further, the cage is easy to carry and to assemble, dismantle and transfer from one room to another, thereby allowing to avoid the possible need of permanently equipping a room for this specific purpose.

Thanks to its modular construction, the cage is very economical in terms of industrial manufacture, due to the reduced number of different required types of construction parts.

In accordance with a preferred embodiment, both lateral and ceiling walls may be provided with a plurality of apertures in the form of a grating or the like, whose size and arrangement on the surface depends on the required attenuation of electromagnetic noise.

The size/s of the apertures and/or the number thereof and/or the total open surface-to-total closed surface ratio, may be such as to ensure a good air circulation, an excellent transparency to outside light, in combination with a predetermined electromagnetic noise suppression level.

The apertures provide an excellent air circulation, e.g. allowing elimination of equipment heat; allow the penetration of outside light, avoiding the need to equip the cage with independent lighting and/or air-conditioning means, which are potential sources of additional noise.

According to a further advantageous improvement, the cage may have at least one door in one or more predetermined areas of one or more side walls.

The frame or the peripheral ledges of the door wings and/or the corresponding contact and/or abutment edges of the side frames may be provided with electric contact generating means along their extensions.

These electric contact generating means may consist, at least partially and/or at least on the wing and/or at least on the side frame, of electric contact generating means which may be elastically stressed against the contact surface and/or wiping contact generating means.

These arrangements provide that the wings have a good electric continuity between each other and between each of them and its respective side frame part, such that, in the closed condition, sufficient electric conductivity characteristics can be maintained. More particularly, the cage part/s provided with entrances have the same shielding characteristics as all the other parts of the cage.

In accordance with a preferred embodiment, the cage may have at least four sides, whereof two parallel sides and one transverse side are rectilinear. The side opposite to the transverse side may be arched, preferably semicircular.

The door wing/s may be provided within the semicircular side.

The wings may be of the type that slides on guides, an upper and a lower one.

Two door wings may be provided at the central area of the semicircular side, having each an opening angle substantially of an eighth of a circle.

Thanks to the above arrangements, the cage has such a size that the volume it delimits is sufficient to perform imaging operations, and at the same time such that it can be integrated in relatively limited spaces. The sliding door solution allows to provide the cage with a wide aperture for carrying in/out the equipment and the patient, even on a stretcher, without increasing cage dimensions during opening/closing operations. The particular shape of the cage and the location of the door wings at the semicircular side always allows to locate the door at the entrance of the room which houses the cage.

Further characteristics and possible improvements of the invention will form the subject of the dependent claims.

BRIEF DESCRIPTION OF THE DRAWINGS

The characteristics of the invention and the advantages derived therefrom will appear more clearly from the following description of a preferred embodiment, illustrated without limitation in the annexed drawings, in which.

DETAILED DESCRIPTION OF THE PREFERRED EMBODIMENTS

Figure 5:
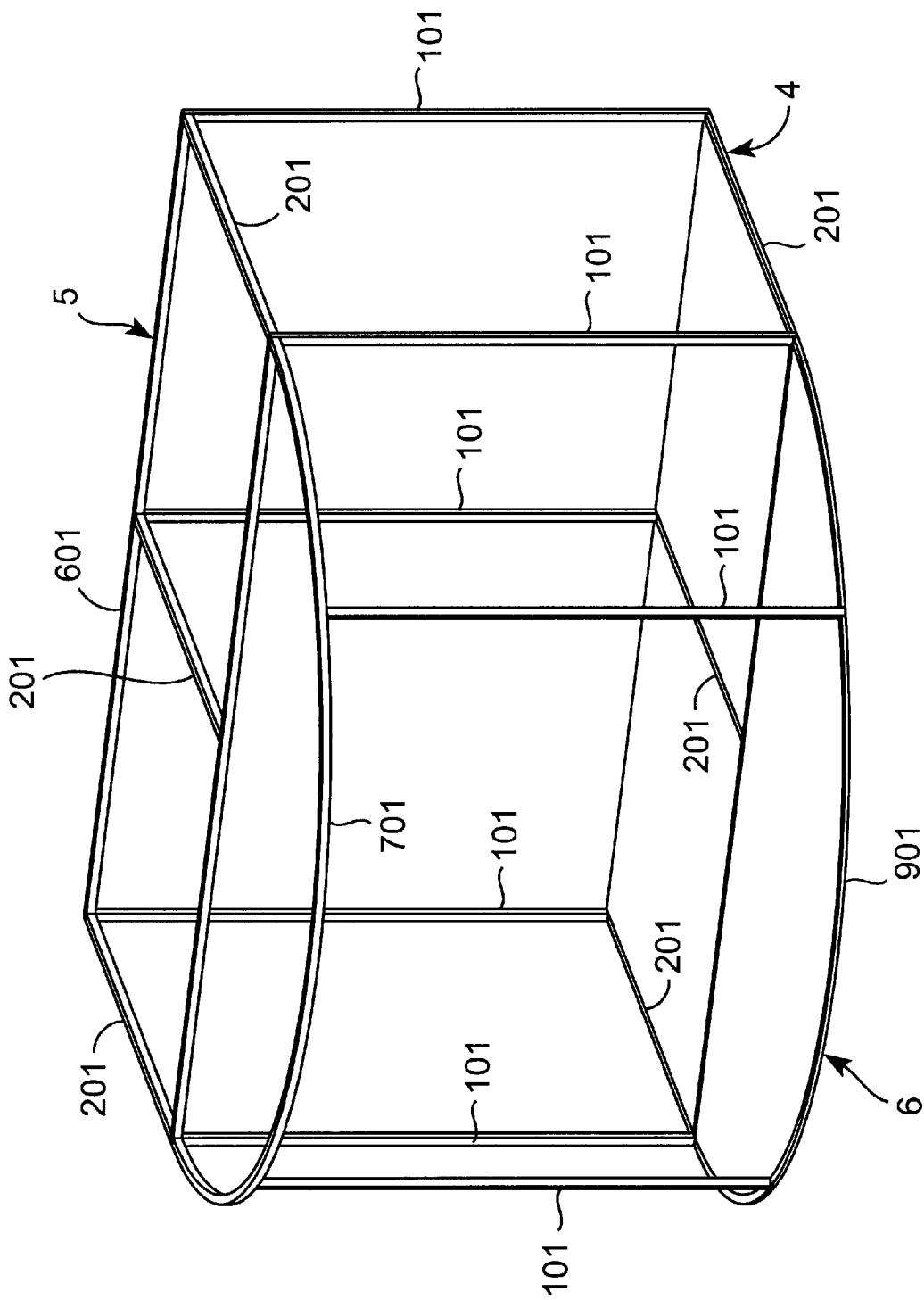
FIG. 5 is a perspective view of the bearing structure of the cage as shown in FIG. 1.

With reference to FIG. 5, a preferred embodiment of the Faraday cage according to the invention comprises a bearing structure 1.

This bearing structure 1 is composed of uprights 101, crossbeams 201 and longitudinal members 601 which can be assembled together preferably in a removable manner. In a preferred embodiment, said longitudinal members 601 may be obtained by joining together two parts, substantially identical to those which form the crossbeams 201, at their ends.

The uprights 101 and crossbeams 201 may be made of any rigid electrically conductive material suitable for the purpose, the use of parts of metal tubular bar, preferably having a square section (see FIG. 10) being preferable.

Figure 11:
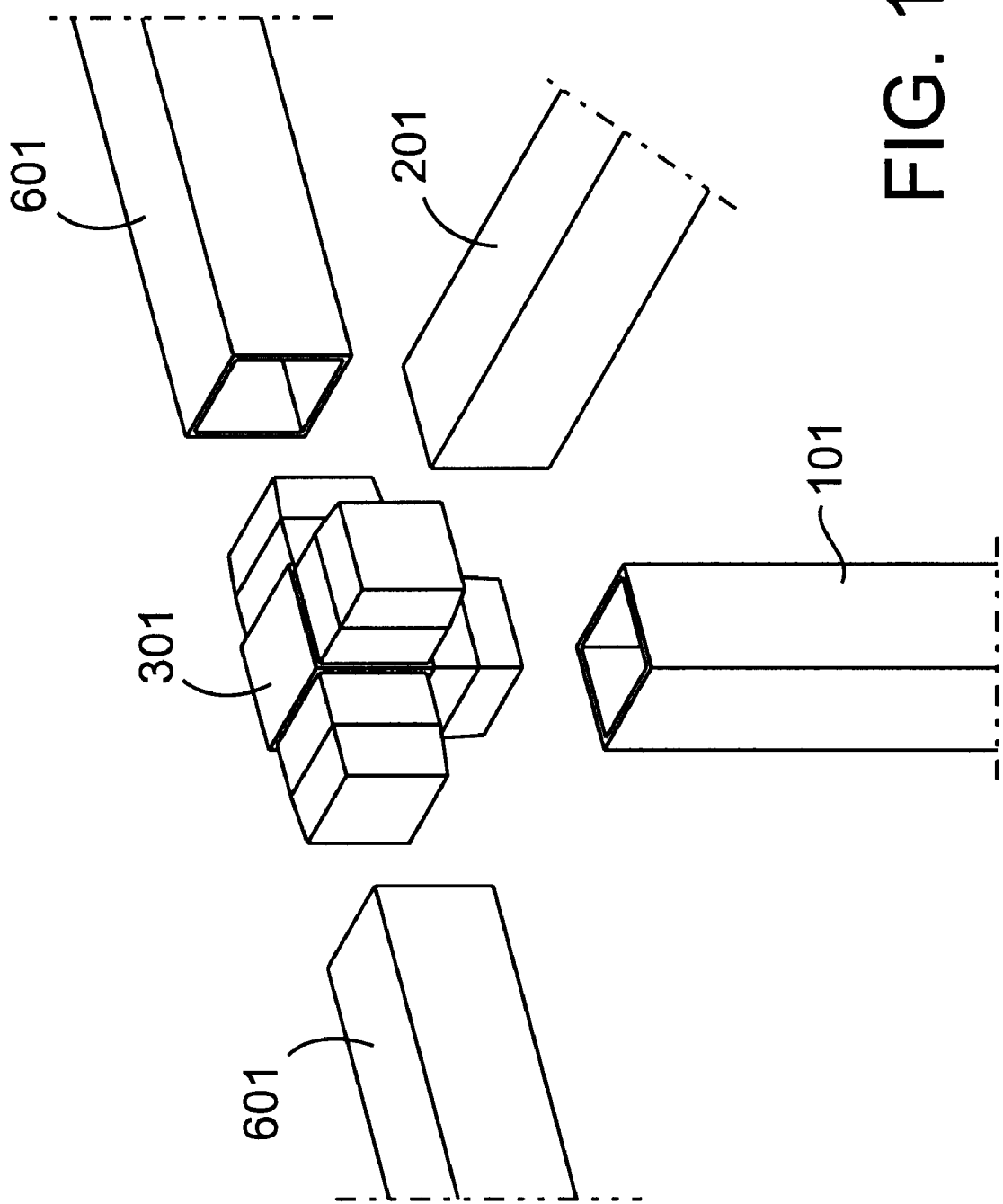
FIG. 11 is an exploded view of an area in which prefabricated parts of the cage structure are joined together.

The uprights 101 and crossbeams 201 are joined together by mechanical and electric connection means, preferably made of the same material as the bearing structure, and preferably of the removable type. FIG. 11 shows an example of connection between uprights 101 and crossbeams 201, obtained by an insert joint 301. Alternatively therewith or in combination thereto, it is possible to provide that the mechanical and electric connection between the parts of the structure 1 is obtained by other types of lock joints, e.g. integral with the parts 101, 201, 601, and/or by using well-known fastening means, such as metal bolts or the like, and/or any other arrangement known in metal structural work.

Anyway, preferably the parts 101, 201, 601 composing the structure 1 consist of a limited number of different types, substantially identical within the same type range. This arrangement provides the advantage of reducing fabrication costs, and simplifies assembly of the cage bearing structure 1.

Alternatively, it is possible to provide that the bearing structure 1 is not, at least partly, a structural part separated from the rest of the cage, and that it is assembled at the same time as the other cage parts.

Figure 10:
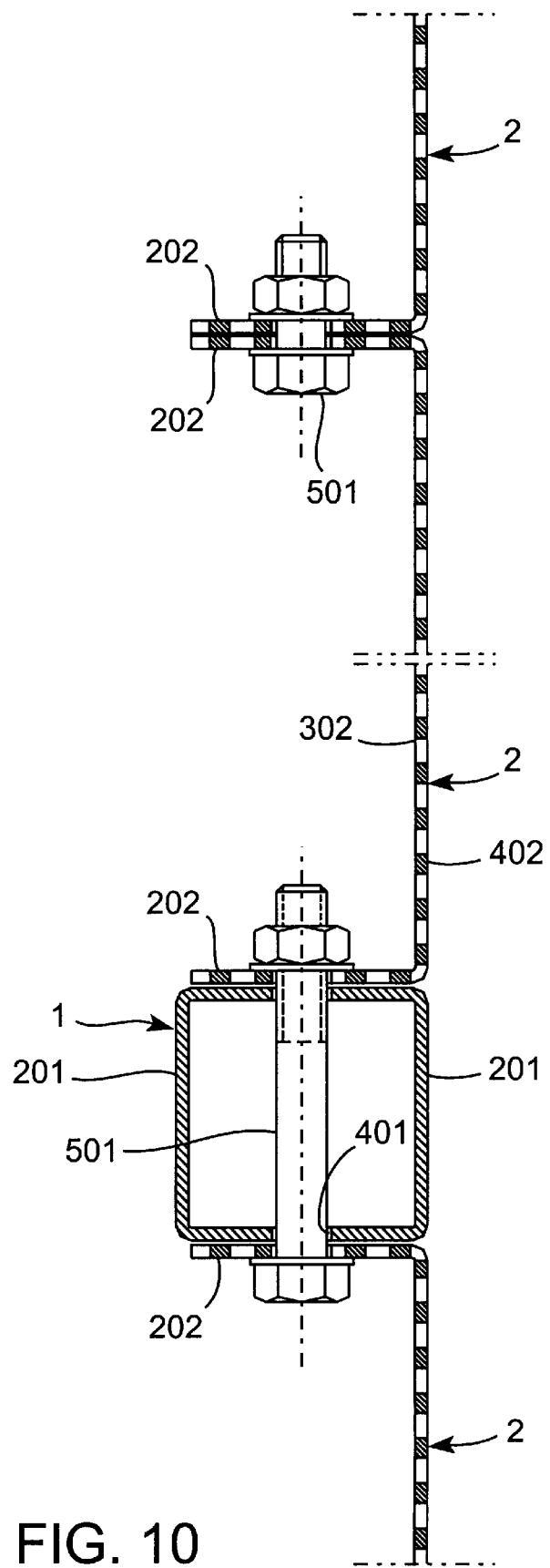
FIG. 10 is a sectional view of peripheral parts of cage panels and of the means for mechanical and electric connection therebetween, in the assembled condition.

Said bearing structure 1 may have hook- or joint-like means for connection to the other components of the cage, such as, for instance, holes 401 for metal bolts 501 or the like (see FIG. 10).

Figure 6A:
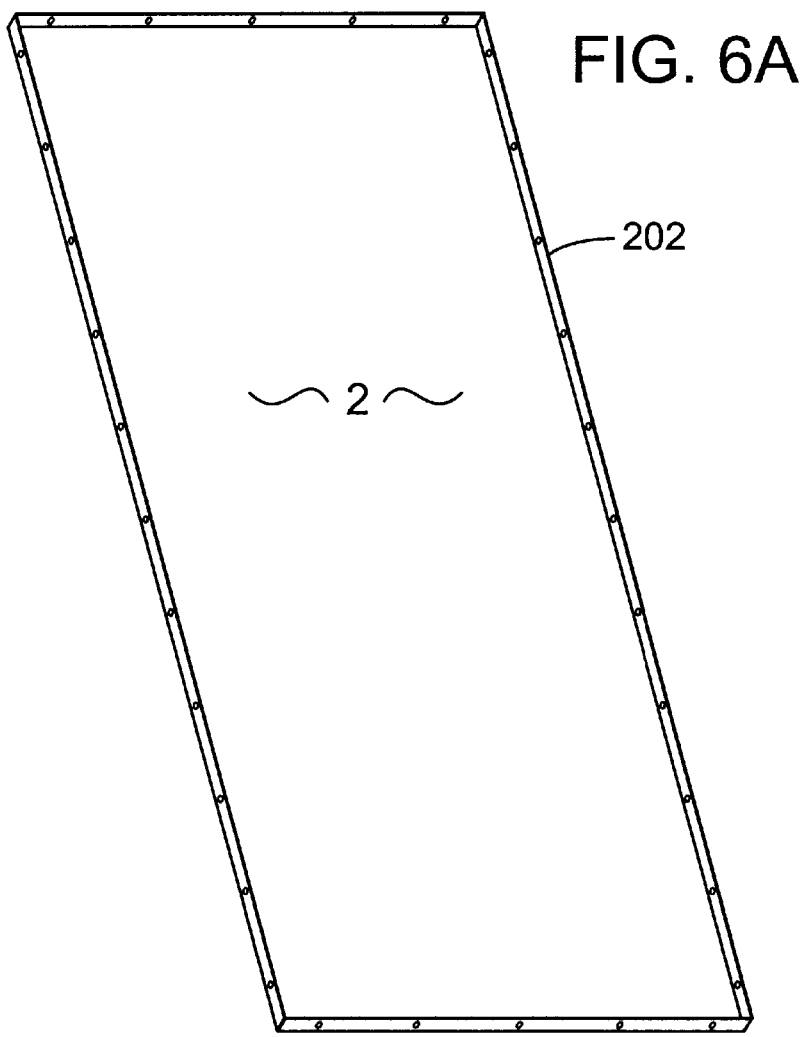
FIG. 6A is a perspective view of a modular construction member in the form of a plane rectangular panel.
Figure 6B:
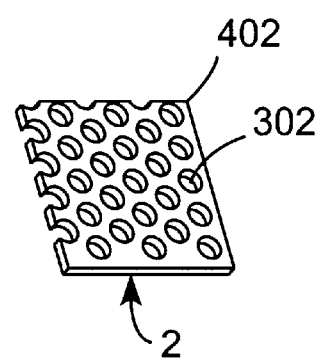
FIG. 6B shows a detail of the panel surface as shown in FIG. 6A.

With reference to FIG. 6A, 6B, the Faraday cage according to the invention has panel wall parts 2, for forming peripheral and/or ceiling and/or floor walls.

The panels 2 include at least one plate 102 made of an electrically conductive material, preferably metal.

These panels 2 may be provided with a peripheral framework 202 integrated in each of them. Said framework 202 may be attached, i.e. fastened, particularly welded, and consist, for instance, of a frame made of a metal bar and joined to the panel 2. Alternatively, the frame 202 may consist of parts formed of one piece with the panels 2, such as ribs, wings, flanges, or the like. Particularly, the frame 202 may consist wholly or partly of peripheral strips of the plate 102 which are bent to form angles, preferably all along the perimeter.

The panels 2 may be fastened, preferably removably, to the various parts 101, 201, 601 of the support structure 1 and/or directly to each other, e.g. by fasteners such as metal bolts 501 or the like. FIG. 10 shows in detail the connection between two adjacent panels, a part of the structure 1 being interposed therebetween, and the direct connection between the peripheral frames of the panels 2 the latter being obtained, in the illustrated example, by bending peripheral strips of the plate 102 made of the same material that forms the panel 2. Particularly, it is possible to provide that the structure 1 has, at least partly, no independent fastening means, and that the panels 2 and the fastening means 501 thereof have a supporting function on the whole structure 1. It is further possible to provide that stiffening means, such as metal straps or other elements, having an electromagnetic sealing function, are interposed between the peripheral frames 202 of adjacent panels 2, and possibly fastened to the bearing structure 1 of the cage. Anyway, the means 301, 501 for connecting together all the components of the cage will have such characteristics as to allow easy and fast assembly and dismantling, and as to provide a good electric continuity between assembled parts, in order to ensure the best electromagnetic shielding effect.

In a preferred embodiment, all the walls of the cage, both side and ceiling walls, i.e. the corresponding panels 2 are provided with a plurality of apertures 302 all over their extension. These apertures preferably consist of circular holes 302 formed in the surface of the plates 102 of the panels 2. These holes 302 may have a diameter of 2 mm to 5 mm, preferably of 2.5 mm to 3.5 mm. Particularly, these plates 102 may consist of a perforated metal sheet 402. Alternatively thereto or in combination therewith, several different materials may be used, such as metal wire net or the like. Anyway, the size of the apertures 302, or more generally the total open surface-to-total closed surface ratio will be such as to ensure a good air circulation, and a good transmission of light emitted from light sources outside the cage, in combination with a desired electromagnetic noise suppression level.

Figure 1:
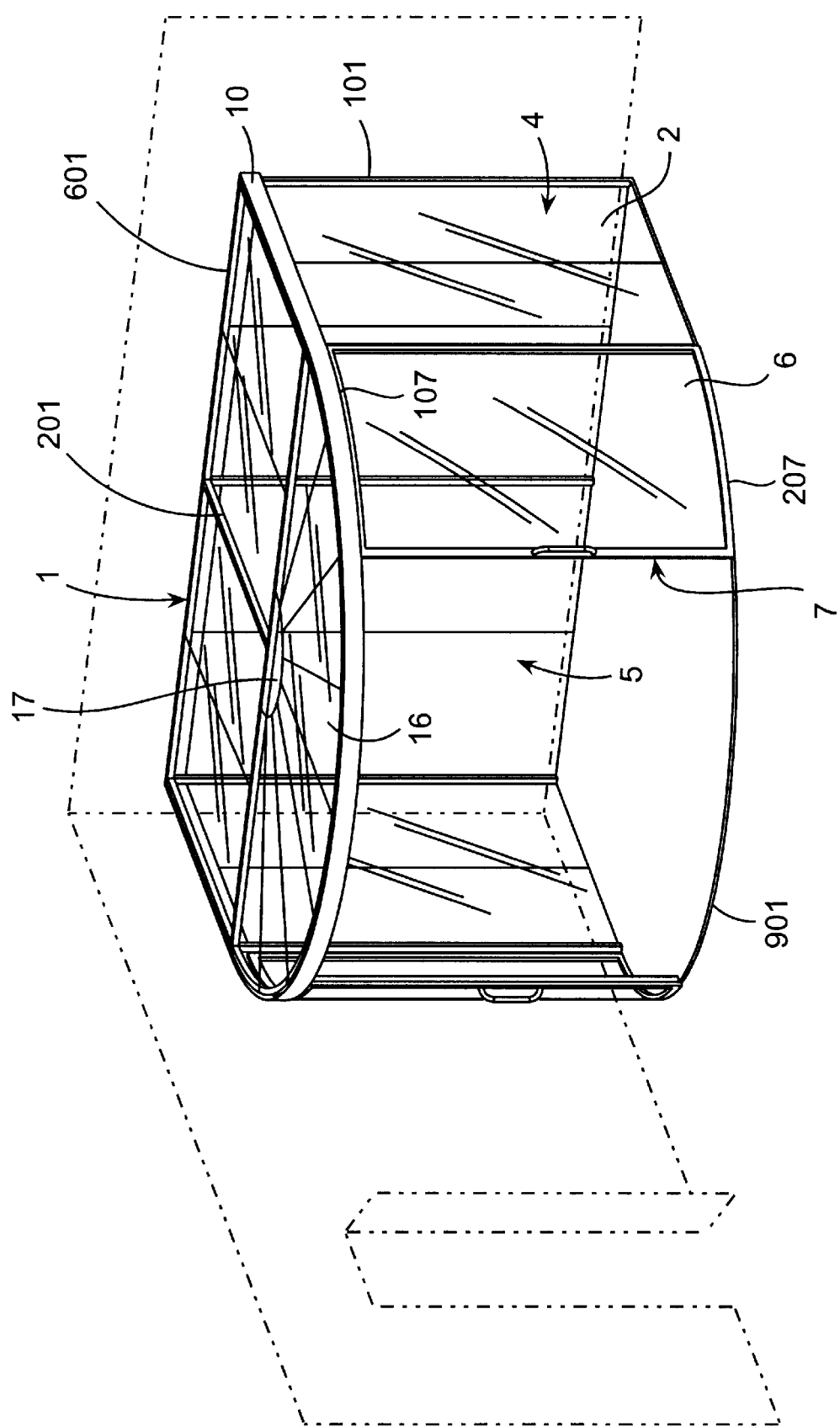
FIG. 1 is a perspective view of a preferred embodiment of the Faraday cage according to the invention, with the door wings in the opened condition.
Figure 2:
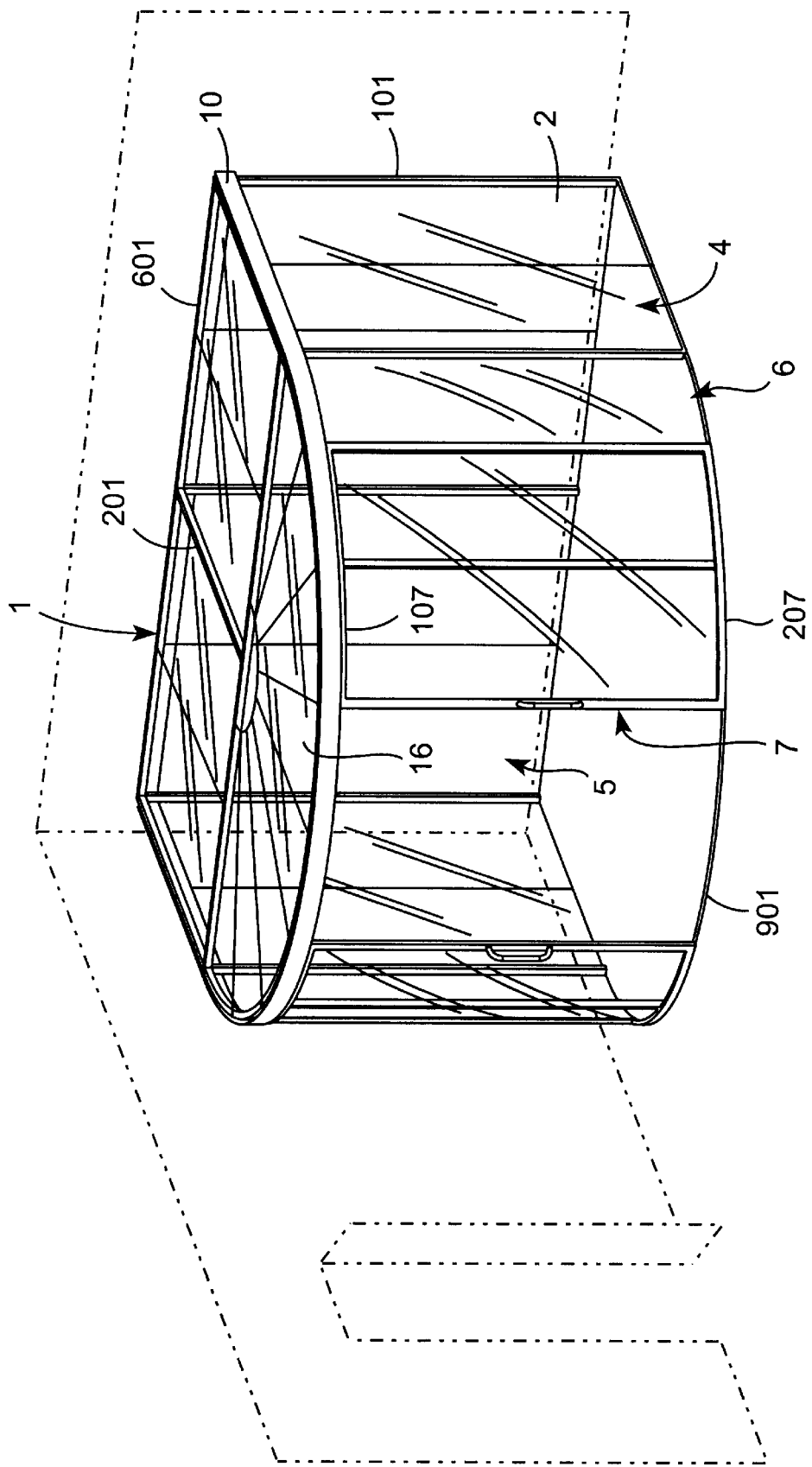
FIG. 2 is a view like that of FIG. 1, with the wings in a partially closed condition.
Figure 3:
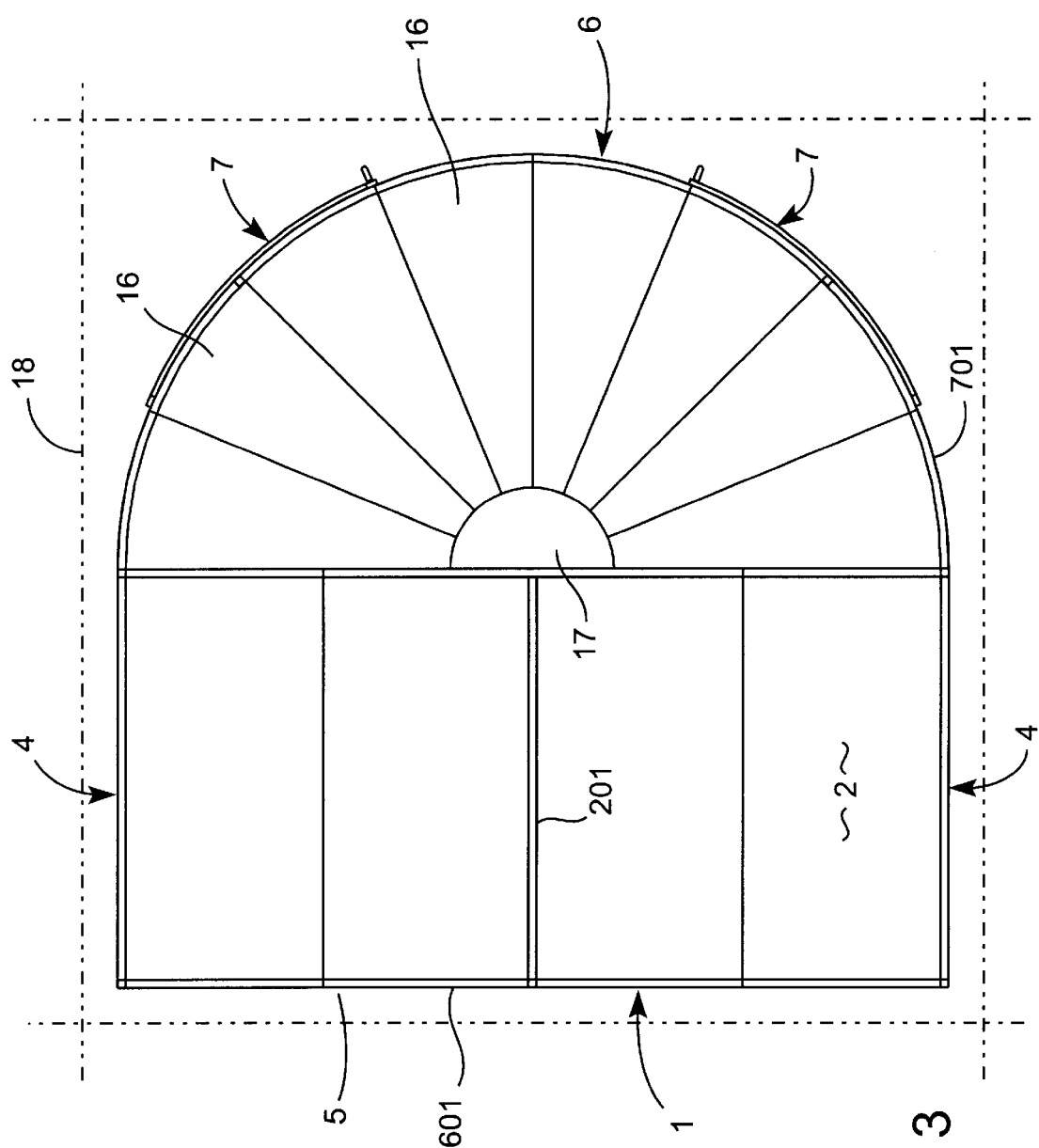
FIG. 3 is a plan view of the cage as shown in FIG. 1, with the door wings in a partially opened condition and with the inside perimeter of the minimum space required for installation thereof outlined in dashed lines.
Figure 4:
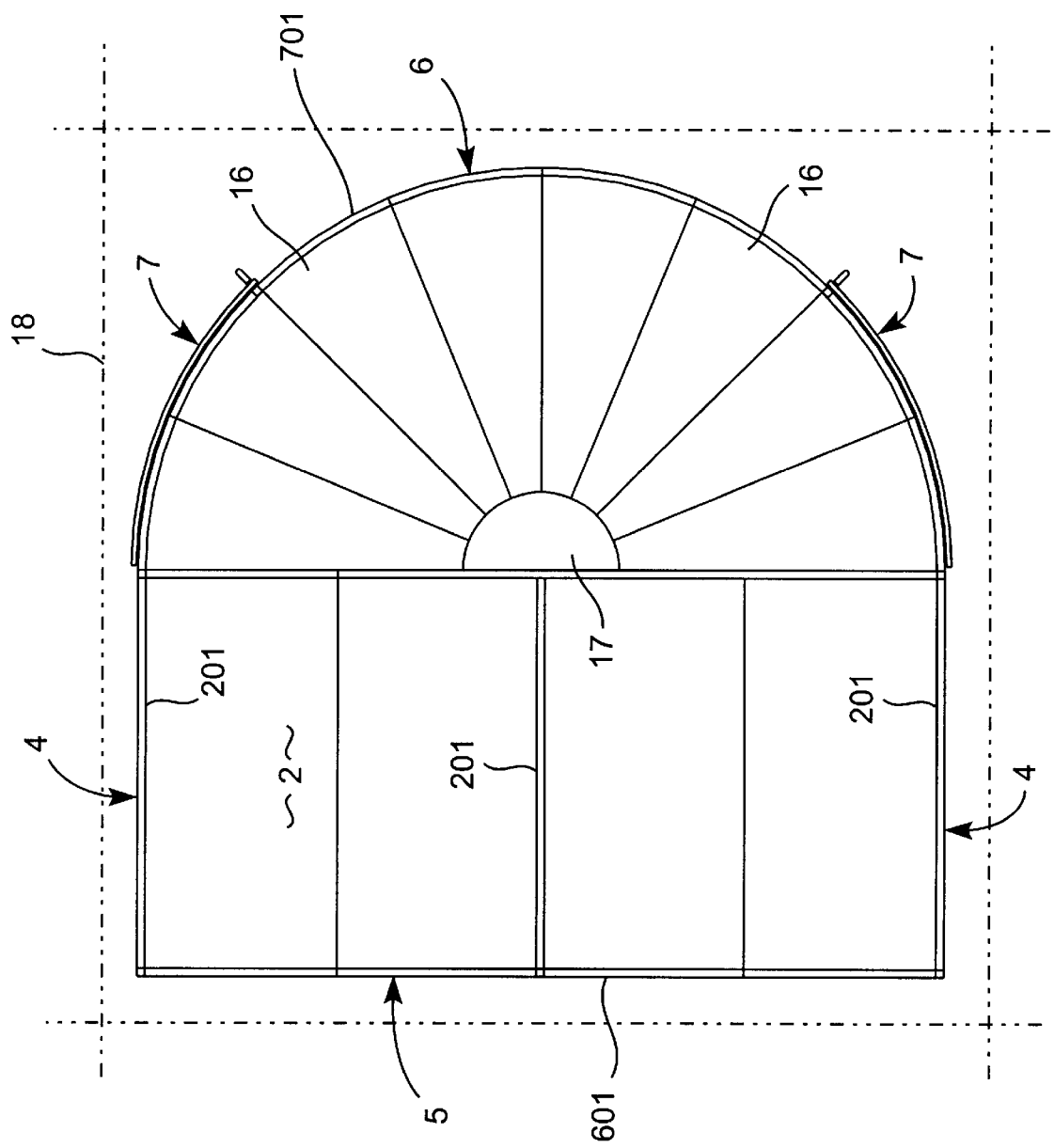
FIG. 4 is a view like that of FIG. 3, with the wings in the wholly opened condition.

With particular reference to FIGS. 3 and 4, a preferred embodiment of the Faraday cage according to the invention has at least four sides, whereof two parallel sides 4 and one transverse side 5 are rectilinear.

The side 6 opposite to the transverse side is semicircular.

The parallel sides 4 are as long as the radius of the semicircular side 6, so that the cage plan can be inscribed (and inserted) in a square 18. The height extension of the cage is slightly smaller, to a predetermined extent, to minimum heights prescribed by law for residential rooms. These limited dimensions, anyway, delimit an inside volume which is suitable for MRI examination. In case of particular requirements, cages with shapes and/or sizes differing from the one shown in the figures may be obviously provided.

With reference to FIGS. 1, 2, 3, 4, the Faraday cage according to the invention has an entrance door, consisting of two door wings 7 located at the central area of the semicircular side 6, each having an opening angle of substantially one eighth of a circle. When both wings 7 are opened, an aperture is obtained whose opening angle is of one quarter of a circle, which is certainly adequate for carrying in/out the equipment and the patient, even on a stretcher. Further, it can be also used when the door for entering the room which houses the cage is off-center with respect to the entrance door of the cage.

Figure 12:
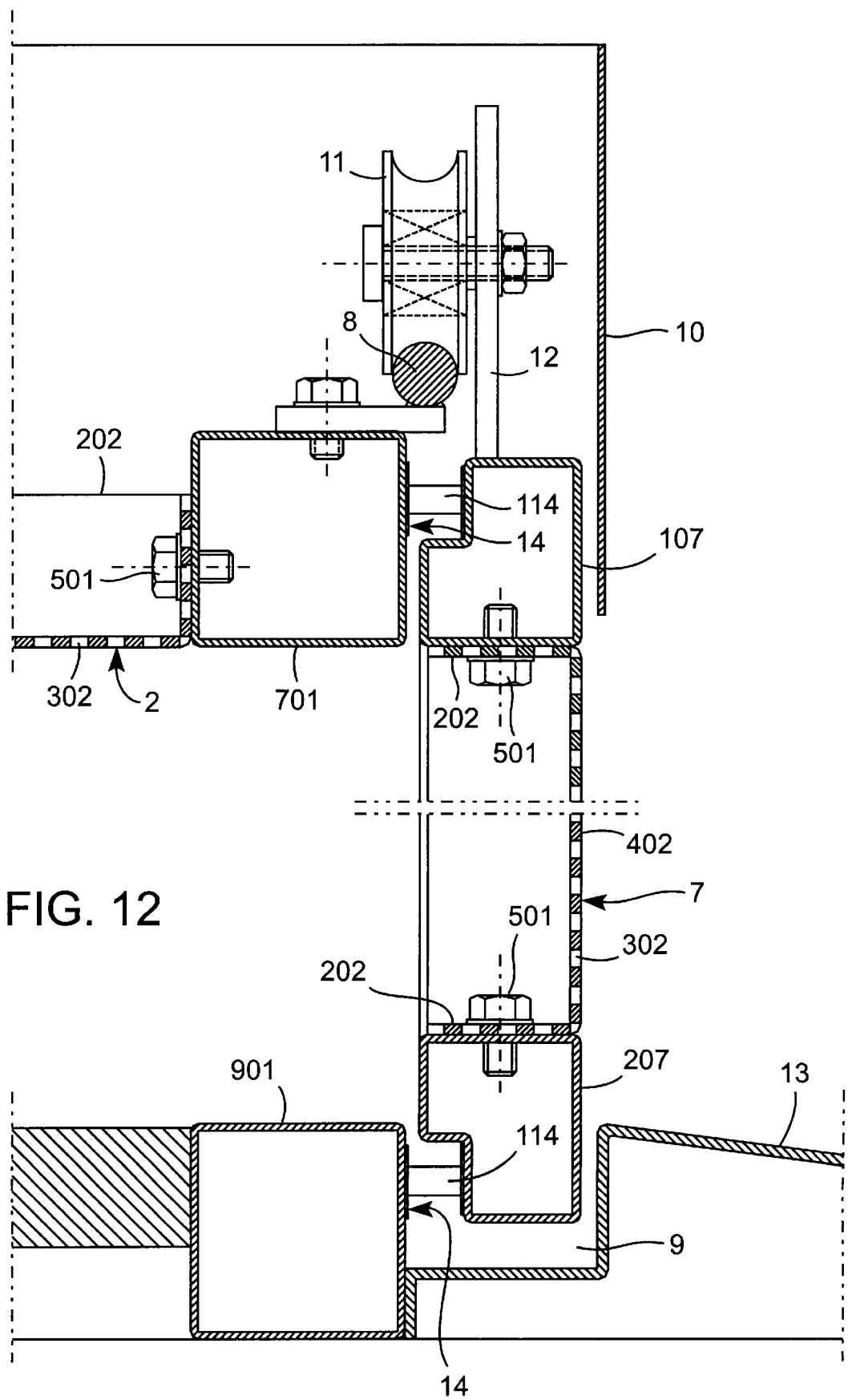
FIG. 12 is a vertical sectional view of the sliding zones of the door wings.

With reference to FIG. 12, the wings 7 are preferably of the type that slides on guides, an upper 8 and a lower 9 one. This arrangement substantially avoids any increase of cage dimensions, when the wings 7 are in the opened condition. Further, the semicircular shape of the side 6, whereto the sliding door wings 7 are associated, provides the advantage of not covering the whole surface of the room 18 where the cage is located, when it has as small dimensions as those shown in the figures.

With reference to FIG. 12, the upper part 107 of the frame of the door wing 7 is provided in a semicircular area, which is delimited, on the side towards the inner part of the cage, by the semicircular ceiling frame part 701 and outside, by a large strip 10, preferably made of metal, and fastened outside it, having the function to protect the sliding parts 8, 11, 12, 107 and other finishing functions.

In said semicircular area, the wings 7 are slidably engaged on a semicircular guide 8 by means of grooved wheels 11, associated to the upper part 107 of the wing frame by means of extensions 12.

The lower guide 9 is delimited inside by the floor semicircular frame part 901 and outside by another semicircular part 13. In the exemplary embodiment as shown, this part forms the entrance threshold 13, and is slightly inclined downwards, having the function to connect the cage floor to the room floor which, for obvious reasons, are on slightly staggered planes.

Hence, the door wings 7 can be opened in a particularly smooth manner, thanks to the sliding system in use and to the fact that each wing 7 is suspended on the upper guide 8, and almost totally friction-free in the lower guide 9, which only has a retaining function.

Obviously, opening and/or sliding systems differing from those shown herein, such as shutter doors or the like, might be provided.

Elastic electric contact generating means 14 of a first type are provided between the outer surfaces of the two members 701, 901 and the corresponding inner surfaces of the parts 107, 207 of the wing frame 7.

Figure 13:
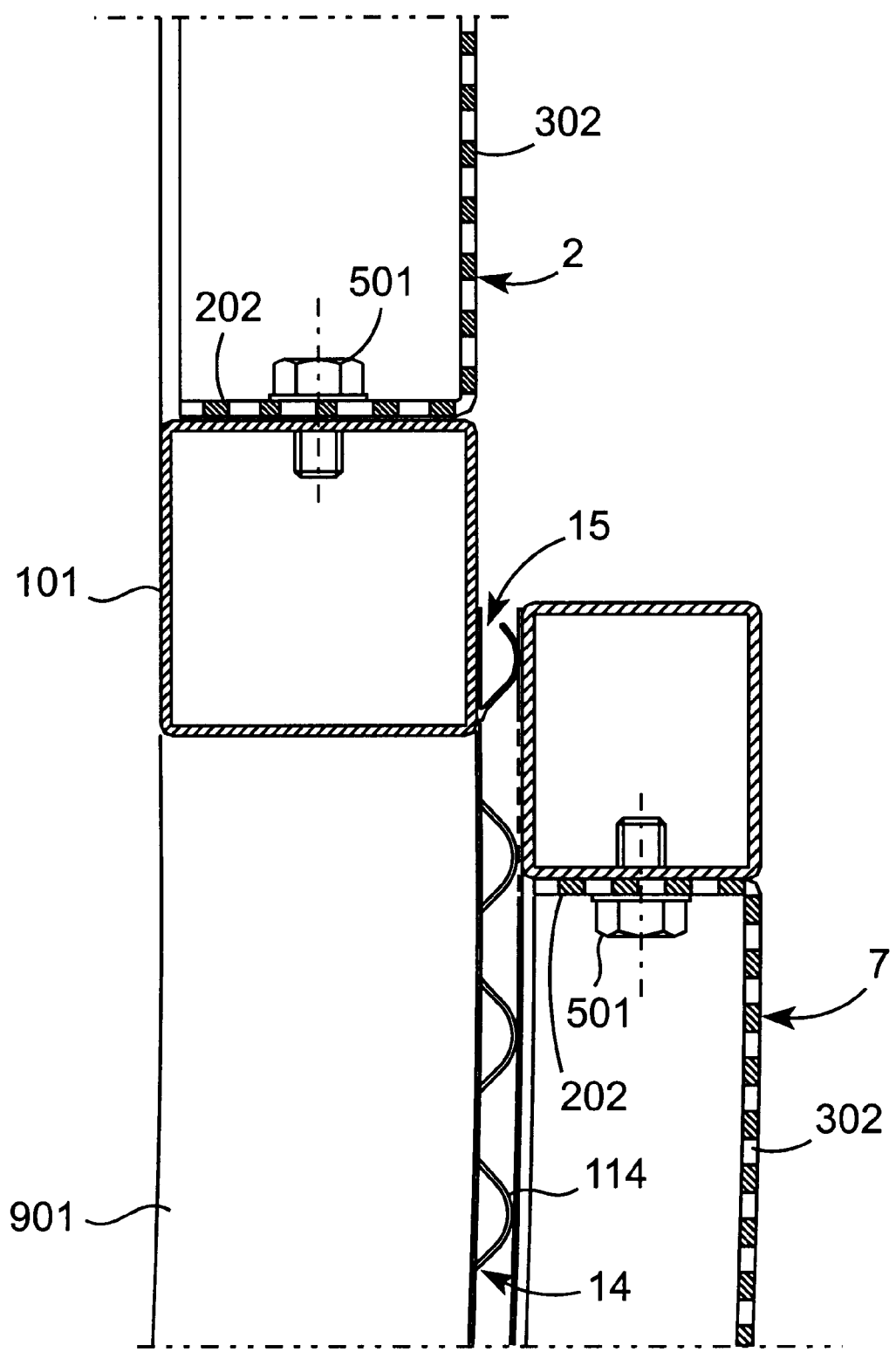
FIG. 13 is a sectional view of the area in which the door wing frame and its respective side frame upright come to contact and of a detail of the elastic electric connection system attached to the sliding guides for the wings, with the wing being in the closed condition.
Figure 14:
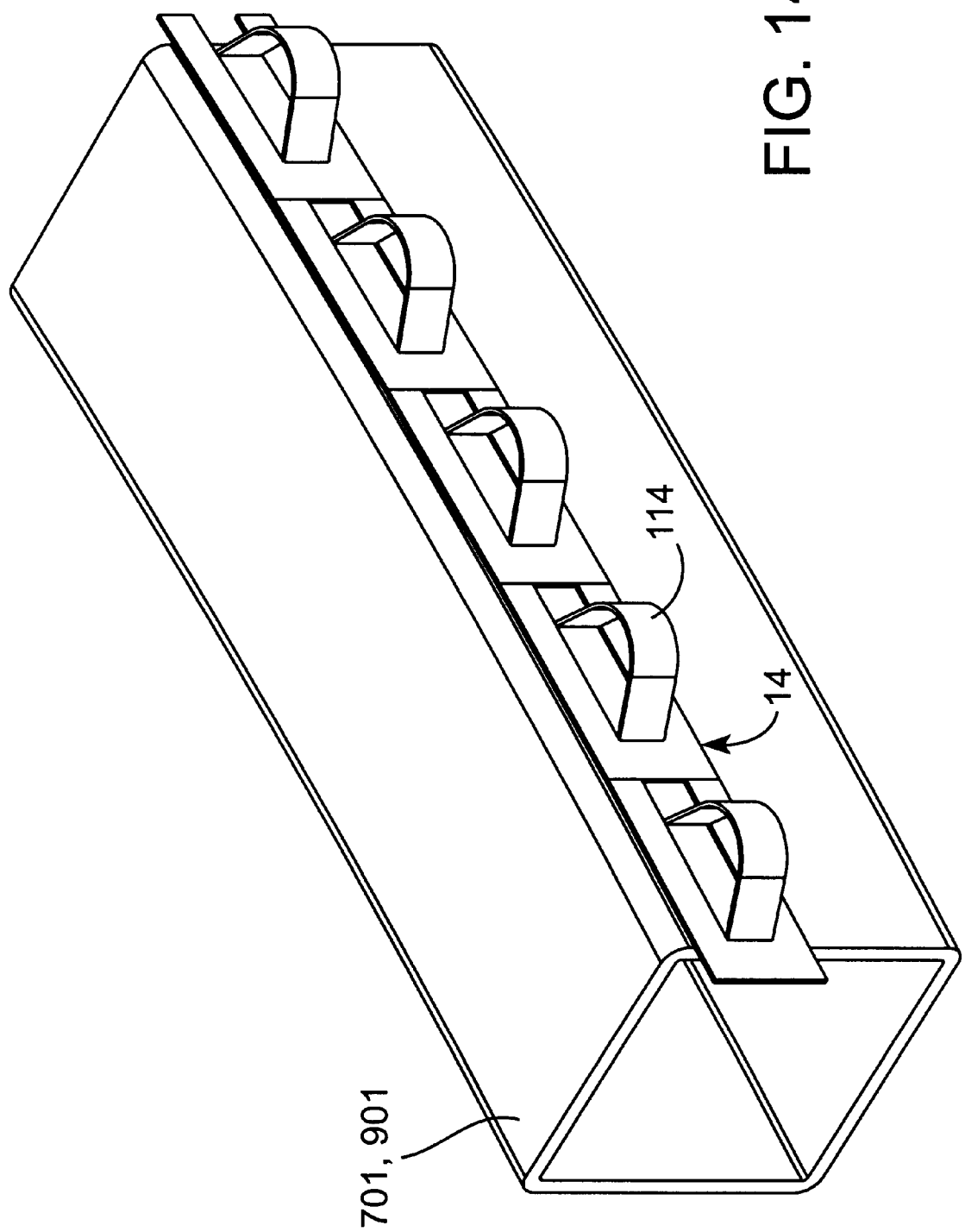
FIG. 14 is a perspective view of a detail of the elastic electric contact generating means of the wiping type, which are attached to the sliding guides for the wings.

As is shown in FIGS. 13 and 14, these means consist of a succession of metal, preferably copper-plated, elements 14, each provided with an elastic outwardly arched blade 114, and arranged in such a way as to form a succession of yielding projections 114. These elastic means 14, in the embodiment as shown, are fixed on the parts 701, 901 of the structure 1, but may be also provided on the corresponding part 107, 207 of the wing frame 7.

Figure 15A:
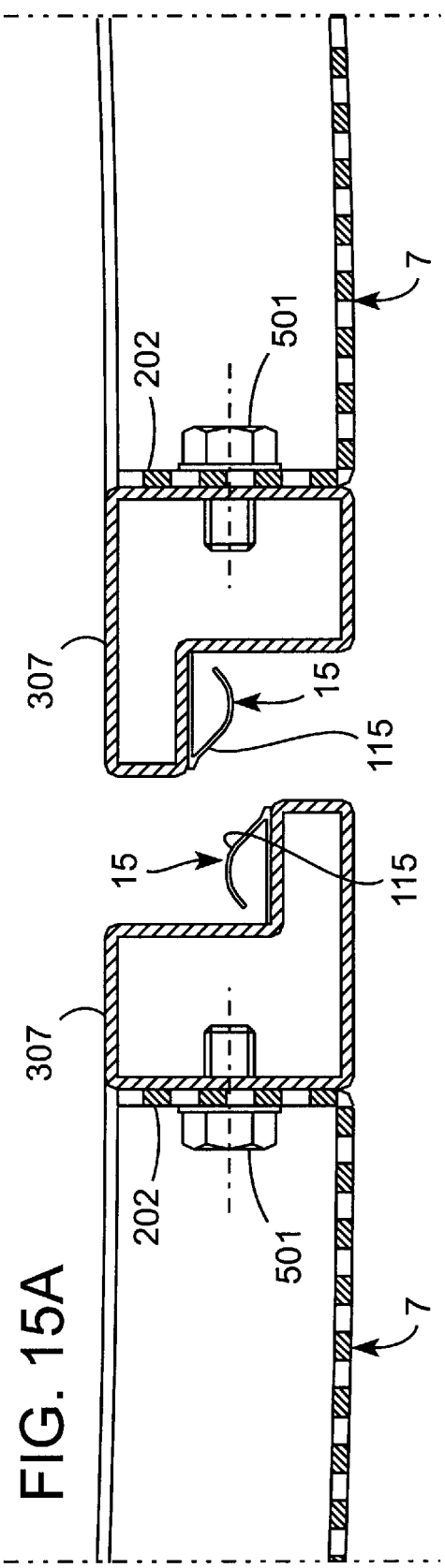
FIG. 15A is a sectional view of the ledge area between wings, with the wings in a partially opened condition.
Figure 15B:
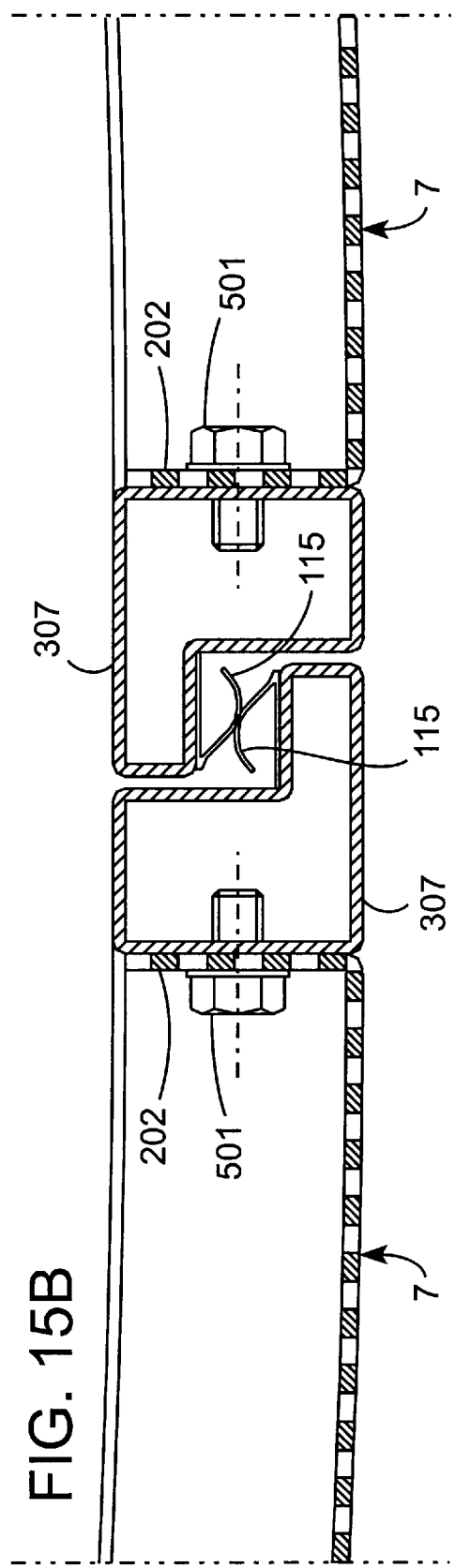
FIG. 15B is a view like that of FIG. 15A, with the wings in the closed condition.

Elastic electric contact generating means 15 of a second type are also provided between the ledges of the two wings 7, as shown in FIGS. 15A and 15B, and also between each wing 7 and the corresponding side frame post 101 (see FIG. 13).

These means 15 are provided with lines of elastic metal, preferably copper-plated blades, having an arched shape and are provided on both opposite contact surfaces.

All the above elastic electric contact generating means 14, 15 have the function to ensure a good electric continuity between the door wings 7, and between the latter and the rest of the cage, when the wings 7 are in the closed condition. By choosing an entrance door with two rigid sliding wings 7 the additional advantage is provided that the number of surfaces to be electrically connected is reduced as compared with other prior art solutions.

Figure 7:
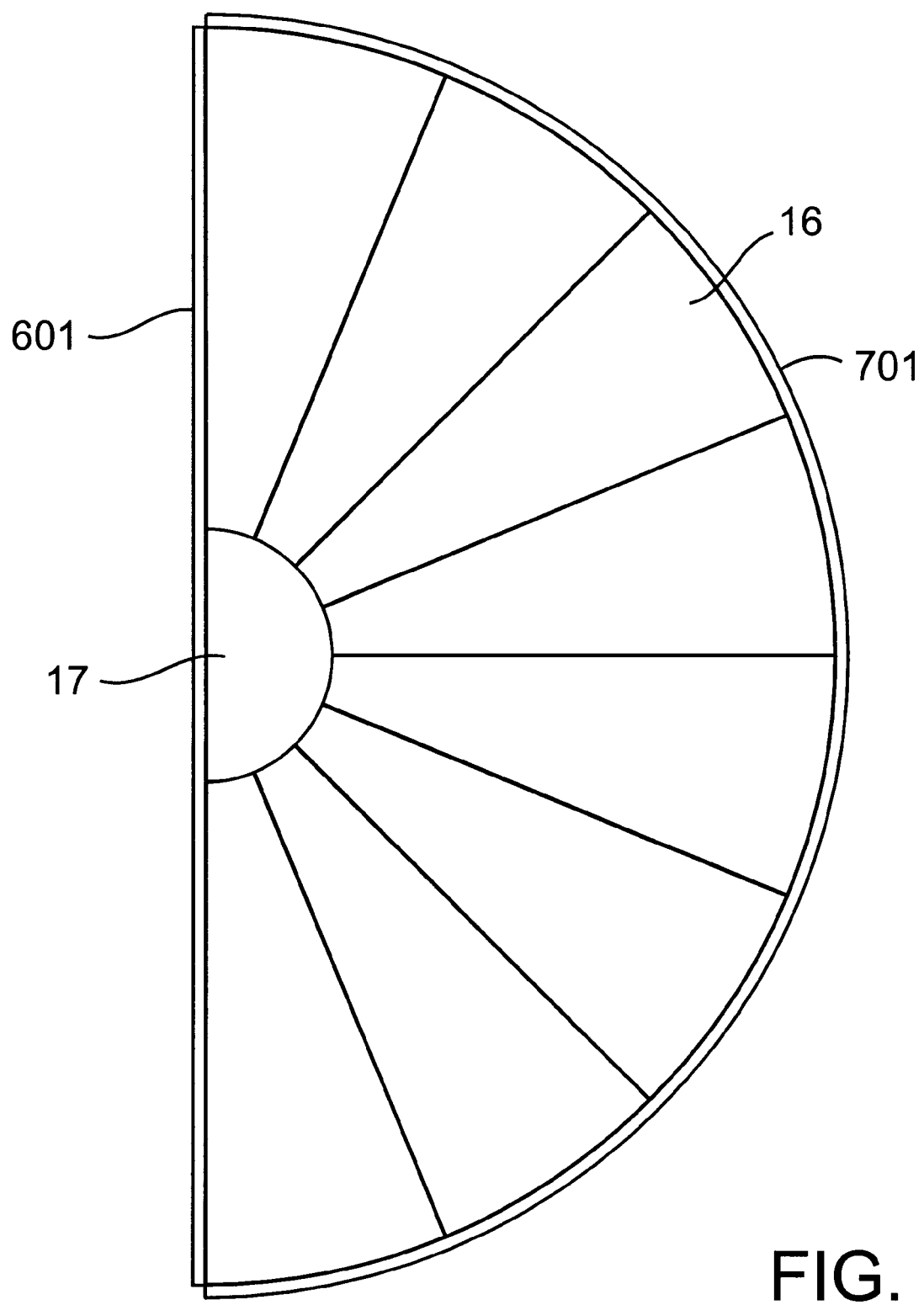
FIG. 7 is a plan view of the semicircular ceiling part of the cage as shown in FIG. 1.
Figure 8:
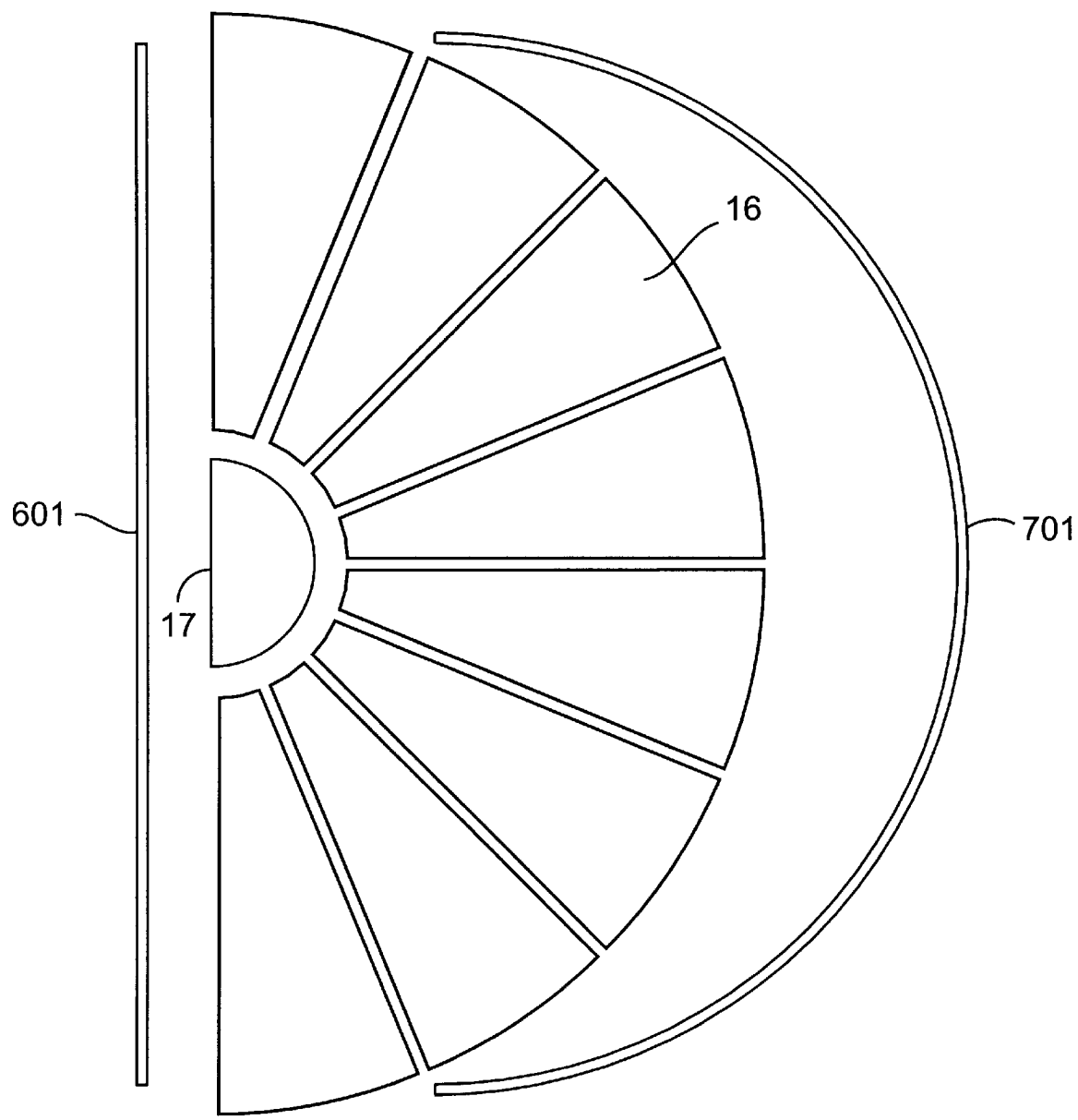
FIG. 8 is an exploded view of the ceiling part as shown in FIG. 7.
Figure 9:
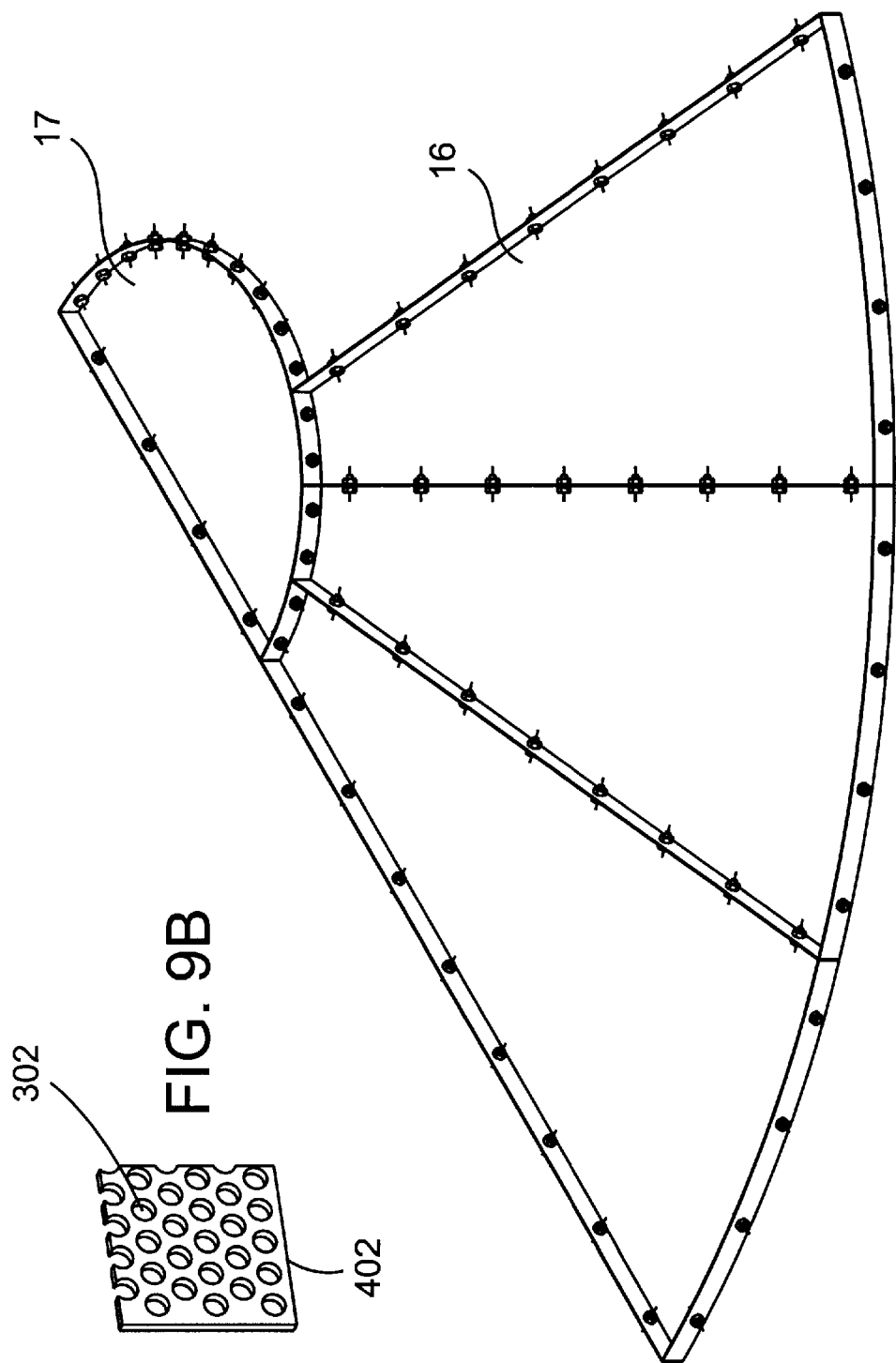
FIG. 9A is a perspective view of a part of the semicircular ceiling part, formed by direct assembly of panels.
FIG. 9B shows a detail of the panel surface as shown in FIG. 9A.

With particular reference to FIGS. 7, 8 and 9A, the ceiling panels of the semicircular area consist of panels 16 each having the shape of sector of a circle, with identical extensions, particularly equal to 1/16 of a circle.

In the radially internal median area of said ceiling part, there is provided an additional semicircular frame part, coaxial thereto, against which the radially internal and arched sides of the ceiling panels 16 having the shape of sectors of a circle, abut. This semicircular part delimits a further semicircular ceiling panel 17.

The panels 16 in the shape of sectors of a circle and the semicircular internal central panel 17 are fastened to each other and to the ceiling part of the bearing structure by one of the means 501 described above with respect to the other cage walls.

The division of the ceiling element into a relatively great number of sectors of a circle is useful for structural stiffening of the ceiling which, as described above, also has the function to support the sliding door wings 7, in its outermost part.

Obviously, the use of the cage may not be limited to the applications described herein, but may be also advantageously applied to any situations requiring the creation of an electromagnetic noise-free environment, for example for radio receiving equipment testing and/or inspection.

Obviously, the invention is not limited to the embodiments described and illustrated herein, but may be greatly varied, especially as regards construction, e.g. by providing a cage which has a size and/or shape differing even considerably from the one described above, without departure from the guiding principle disclosed above and claimed below.

What is claimed is:

1. A Faraday cage for use with a diagnostic device in an existing structure, the cage comprising:
   prefabricated components assembled within the existing structure forming an enclosed space suitable for containing a patient wherein said prefabricated components are electrically interconnected; and
   an electrical conductor attached to at least one of the prefabricated components wherein the electrical conductor maintains the Faraday cage in a predetermined electrically stable state.

2. The Faraday cage of claim 1, wherein the electrically stable state is a grounded state.

3. The Faraday cage of claim 2, wherein at least a portion of the Faraday cage is made of electrically conductive material.

4. The Faraday cage of claim 3, wherein the prefabricated components are assembled with hand tools, and the assembled prefabricated components are disassembled with hand tools.

5. The Faraday cage of claim 4, wherein the Faraday cage is constructed from a plurality of modular sections, each of said modular sections comprising some of the prefabricated components.

6. The Faraday cage of claim 2, wherein the prefabricated components comprise uprights, crossbeams, and panels.

7. The Faraday cage of claim 6, wherein the uprights, crossbeams, and panels are removably fastened together.

8. The Faraday cage of claim 7, wherein the panels include peripheral fastening flanges, and the panels are attached to one another, the uprights, and the crossbars with removable fasteners.

9. The Faraday cage of claim 8, wherein the uprights and crossbars are connected by joints.

10. The Faraday cage of claim 9, further comprising at least one door wherein the at least one door remains in constant electrical connection with the prefabricated components.

11. The Faraday cage of claim 10, wherein the door is a sliding door.

12. The Faraday cage of claim 11, further comprising at least one resilient tab resiliently displaced by the at least one sliding door forming the constant electrical connection with the prefabricated components.

13. The Faraday cage of claim 12, wherein the Faraday cage includes two parallel sides, a transverse side connected to ends of the parallel sides forming a rectilinear area, and a curved side opposite the transverse side connected to other ends of the parallel sides forming a curved area.

14. The Faraday cage of claim 13, wherein the curved side is semicircular and extending away from the transverse side.

15. The Faraday cage of claim 14, wherein the parallel sides have a length equal to a radius of the semicircular curved side.

16. The Faraday cage of claim 15, wherein the at least one door is disposed on the semicircular curved side.

17. The Faraday cage of claim 16, further comprising support means for reinforcing the rigidity of the Faraday cage.

18. The Faraday cage of claim 17, wherein the panels are perforated.

19. The Faraday cage of claim 18, wherein the perforated panels have a ratio of open space formed by the perforations to solid surface area whereby the open spaces provide ventilation and light from the existing structure to the enclosed space, and the solid surface area suppresses a predetermined level of electromagnetic noise.

20. The Faraday cage of claim 18, wherein the perforations on the surface of the panels are of a size and arrangement to attenuate electromagnetic noise to a desired level.

21. The Faraday cage of claim 19, further comprising a top wherein the top is formed by removably fastening perforated rectilinear panels for covering the rectilinear area formed by the parallel sides and the transverse side, and a perforated semicircular panel removably fastened to at least one of the perforated rectilinear panels in a central location and perforated triangular panels radiating from the perforated semicircular panel for covering the semicircular area wherein the perforated triangular panels are removably fastened to one another, the perforated semicircular panel, and the perforated rectilinear panels.

22. The Faraday cage of claim 20, further comprising a top wherein the top is formed by removably fastening perforated rectilinear panels for covering the rectilinear area formed by the parallel sides and the transverse side, and a perforated semicircular panel removably fastened to at least one of the perforated rectilinear panels in a central location and perforated triangular panels radiating from the perforated semicircular panel for covering the semicircular area wherein the perforated triangular panels are removably fastened to one another, the perforated semicircular panel, and the perforated rectilinear panels.

23. The Faraday cage of claim 1, wherein the electrically stable state is an electrical potential state.

24. The Faraday cage of claim 23, wherein at least a portion of the Faraday cage is made of electrically conductive material.

25. The Faraday cage of claim 24, wherein the prefabricated components are assembled with hand tools, and the assembled prefabricated components are disassembled with hand tools.

26. The Faraday cage of claim 25, wherein the Faraday cage is constructed from a plurality of modular sections, each of said modular sections comprising some of the prefabricated components.

27. The Faraday cage of claim 23, wherein the prefabricated components comprise uprights, crossbeams, and panels.

28. The Faraday cage of claim 27, wherein the uprights, crossbeams, and panels are removably fastened together.

29. The Faraday cage of claim 28, wherein the panels include peripheral fastening flanges, and the panels are attached to one another, the uprights, and the crossbars with removable fasteners.

30. The Faraday cage of claim 29, wherein the uprights and crossbars are connected by joints.

31. The Faraday cage of claim 30, further comprising at least one door wherein the at least one door remains in constant electrical connection with the prefabricated components.

32. The Faraday cage of claim 31, wherein the door is a sliding door.

33. The Faraday cage of claim 32, further comprising at least one resilient tab resiliently displaced by the at least one sliding door forming the constant electrical connection with the prefabricated components.

34. The Faraday cage of claim 33, wherein the Faraday cage includes two parallel sides, a transverse side connected to ends of the parallel sides forming a rectilinear area, and a curved side opposite the transverse side connected to other ends of the parallel sides forming a curved area.

35. The Faraday cage of claim 34, wherein the curved side is semicircular and extending away from the transverse side.

36. The Faraday cage of claim 35, wherein the parallel sides have a length equal to a radius of the semicircular curved side.

37. The Faraday cage of claim 36, wherein the at least one door is disposed on the semicircular curved side.

38. The Faraday cage of claim 37, further comprising support means for reinforcing the rigidity of the Faraday cage.

39. The Faraday cage of claim 38, wherein the panels are perforated.

40. The Faraday cage of claim 39, wherein the perforated panels have a ratio of open space formed by the perforations to solid surface area whereby the open spaces provide ventilation and light from the existing structure to the enclosed space, and the solid surface area suppresses a predetermined level of electromagnetic noise.

41. The Faraday cage of claim 39, wherein the perforations on the surface of the panels are of a size and arrangement to attenuate electromagnetic noise to a desired level.

42. The Faraday cage of claim 40, further comprising a top wherein the top is formed by removably fastening perforated rectilinear panels for covering the rectilinear area formed by the parallel sides and the transverse side, and a perforated semicircular panel removably fastened to at least one of the perforated rectilinear panels in a central location and perforated triangular panels radiating from the perforated semicircular panel for covering the semicircular area wherein the perforated triangular panels are removably fastened to one another, the perforated semicircular panel, and the perforated rectilinear panels.

43. The Faraday cage of claim 41, further comprising a top wherein the top is formed by removably fastening perforated rectilinear panels for covering the rectilinear area formed by the parallel sides and the transverse side, and a perforated semicircular panel removably fastened to at least one of the perforated rectilinear panels in a central location and perforated triangular panels radiating from the perforated semicircular panel for covering the semicircular area wherein the perforated triangular panels are removably fastened to one another, the perforated semicircular panel, and the perforated rectilinear panels.

44. A Faraday cage for use with a diagnostic device in an existing structure, the cage comprising:
  prefabricated components assembled within the existing structure forming an enclosed space suitable for containing a patient wherein said prefabricated components are electrically interconnected;
  the prefabricated components include perforated panels; and
  an electrical conductor attached to at least one of the prefabricated components wherein the electrical conductor maintains the Faraday cage in a predetermined electrically stable state.

45. The Faraday cage of claim 44, wherein the perforated panels have a ratio of open space formed by the perforations to solid surface area whereby the open spaces provide ventilation and light from the existing structure to the enclosed space, and the solid surface area suppresses a predetermined level of electromagnetic noise.

46. The Faraday cage of claim 44, wherein the perforations on the surface of the panels are of a size and arrangement to attenuate electromagnetic noise to a desired level.

47. A Faraday cage for use with a diagnostic device in an existing structure, the cage comprising:
  two parallel sides, each parallel side having a first and a second end;
  a transverse side electrically connected to the first ends of the parallel sides forming a rectilinear area;
  a curved side disposed opposite the transverse side electrically connected to the second ends of the parallel sides forming a curved area;
  a top and a bottom electrically connected to the parallel sides, the transverse side, and the curved side forming an enclosed space suitable for containing a patient; and
  an electrical conductor attached to at least one of the parallel sides, transverse side, curved side, top, and bottom wherein the electrical conductor maintains the Faraday cage in a predetermined electrically stable state.

48. The Faraday cage of claim 47, wherein the curved side is semicircular and extending away from the transverse side.

49. The Faraday cage of claim 48, wherein the parallel sides have a length equal to a radius of the semicircular curved side.

50. The Faraday cage of claim 49, further comprising at least one door disposed on the semicircular curved side and in constant electrical connection with the semicircular curved side.

* * * * *